United States Patent
Chang

(10) Patent No.: US 11,152,188 B2
(45) Date of Patent: Oct. 19, 2021

(54) NANO VACUUM TUBE

(71) Applicant: Taiwan Semiconductor Manufacturing Co., Ltd., Hsin-Chu (TW)

(72) Inventor: Hsien-Yu Chang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/751,502

(22) Filed: Jan. 24, 2020

(65) Prior Publication Data

US 2020/0161085 A1 May 21, 2020

Related U.S. Application Data

(62) Division of application No. 15/901,802, filed on Feb. 21, 2018, now Pat. No. 10,566,173.

(60) Provisional application No. 62/538,914, filed on Jul. 31, 2017.

(51) Int. Cl.
H01J 37/244 (2006.01)
H01J 37/06 (2006.01)
H01L 31/0352 (2006.01)
H01L 31/18 (2006.01)
H01J 37/28 (2006.01)
H01J 37/073 (2006.01)

(52) U.S. Cl.
CPC ........... *H01J 37/244* (2013.01); *H01J 37/06* (2013.01); *H01J 37/073* (2013.01); *H01J 37/28* (2013.01); *H01L 31/035281* (2013.01); *H01L 31/18* (2013.01); *H01J 2237/062* (2013.01); *H01J 2237/1205* (2013.01); *H01J 2237/2448* (2013.01); *H01J 2237/24475* (2013.01); *H01J 2237/24592* (2013.01); *H01J 2237/2522* (2013.01); *H01J 2237/2561* (2013.01); *H01J 2237/2817* (2013.01)

(58) Field of Classification Search
CPC .................................................... H01J 37/244
USPC ....................................................... 257/429
See application file for complete search history.

(56) References Cited

U.S. PATENT DOCUMENTS 5,569,973 A * 10/1996 Zimmerman ........... H01J 9/025
313/309
6,083,069 A 7/2000 Lu

* cited by examiner

Primary Examiner — Hsin Yi Hsieh
(74) Attorney, Agent, or Firm — Duane Morris LLP

(57) ABSTRACT

A semiconductor device includes a tube-like structure comprising a plurality of dielectric layers and conductor layers that are disposed on top of one another; a conductor tip integrally formed with a cap conductor layer that is disposed on a top surface of the tube-like structure, wherein the conductor tip extends to a central hole of the tube-like structure; and at least one photodetector formed within a bottom portion of the tube-like structure.

20 Claims, 21 Drawing Sheets

NANO VACUUM TUBE

CROSS-REFERENCE TO RELATED APPLICATION

This application is a division of U.S. patent application Ser. No. 15/901,802, filed Feb. 21, 2018 which claims priority to U.S. Provisional Patent Application No. 62/538,914, filed on Jul. 31, 2017, each of which are incorporated by reference herein in their entireties.

BACKGROUND

Integrated circuits (IC's) typically include a large number of components, for example, transistors, resistors, capacitors, interconnection lines, etc. In accordance with each generation of technology nodes, each component of the IC may be formed as a respective structure on a chip (e.g., planer MOSFET's and FinFETs). In other words, each IC may have a respective surface configuration defined by its respective components. In general, a scanning electron microscopy (SEM) and an atomic force microscopy (AFM) are used to provide respective surface configurations of the plural components of the IC (i.e., a surface topography of the IC) so as to examine whether each of the components is properly fabricated during each of various fabrication stages.

The AFM typically relies on repulsive forces between a specimen substrate and an AFM probe tip to detect surface variations over the specimen substrate so as to reconstruct a respective topography of the specimen substrate using the surface variations. On the other hand, the SEM typically uses an electron beam to scan across a specimen substrate and one or more detectors to collect intensity variations of electrons scattered back from the specimen substrate so as to reconstruct a respective topography of the specimen substrate using the intensity variations of scattered-back electrons.

However, as the technology nodes continue to decrease in size, the SEM and AFM may each encounter various issues such as, for example, the AFM's low throughput (due to a limited number of AFM probe tips), possibilities to damage a specimen (due to the necessary contact of the AFM probe tip with the specimen), and the SEM's low throughput (due to a limited number of electron beams). Thus, conventional techniques to provide an IC's surface topography are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
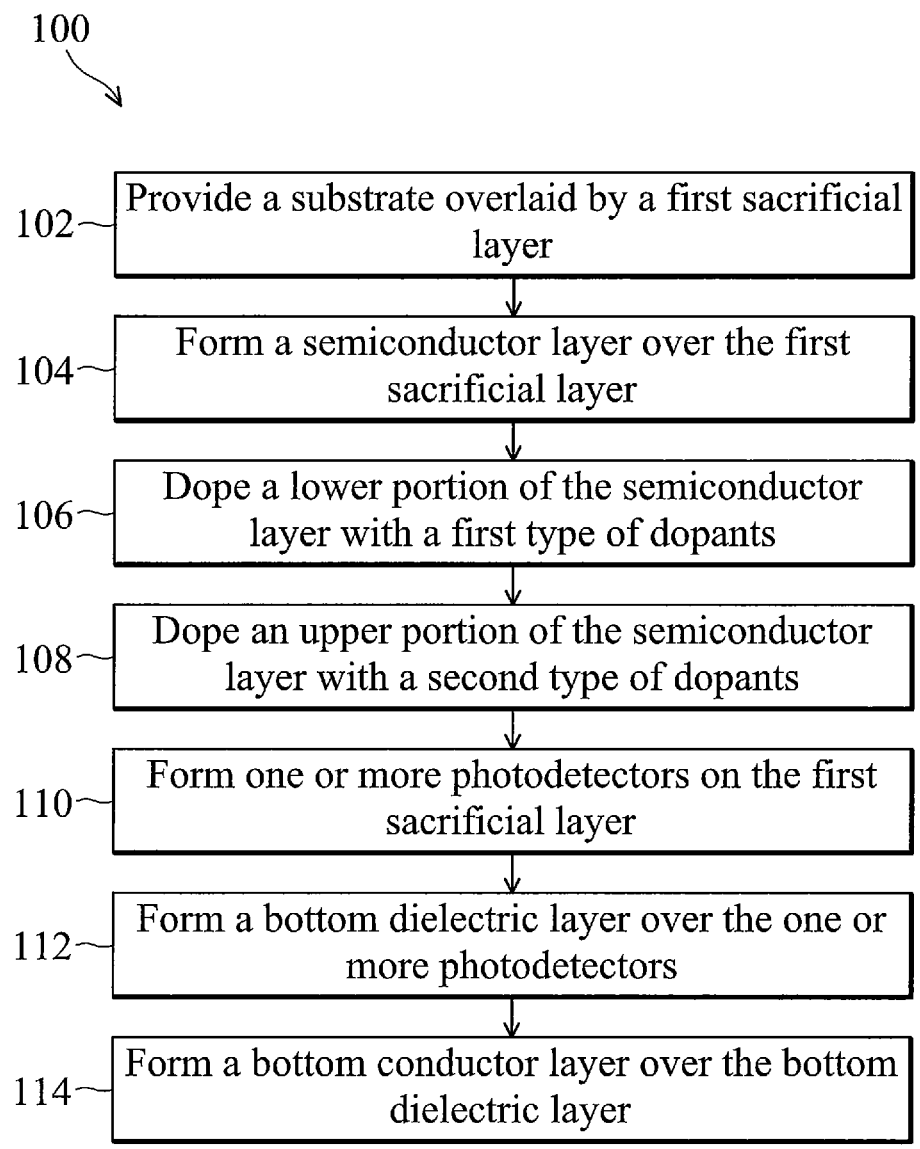
FIGS. 1A, 1B, and 1C illustrate a flow chart of an embodiment of a method to form a semiconductor device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device that can be used to reconstruct a surface topography of an integrated circuit (IC). Further, the disclosed semiconductor device can be made by complementary metal oxide semiconductor (CMOS)-compatible fabrication techniques, which allows a plurality of such semiconductor devices to be formed as an array such that the low throughput issue that the above-mentioned conventional techniques are facing can be advantageously avoided. In some embodiments, the disclosed semiconductor device includes a conductor tip formed within a tube, and plural photodetectors formed around a bottom surface of the tube. More particularly, in some embodiments, the conductor tip is configured to emit a plurality of electrons onto a specimen's surface (e.g., a fully or partially fabricated IC's surface), and the plural photodetectors are each configured to collect corresponding second electrons that are back scattered from the surface along some respective directions. As such, a relatively accurate surface topography of the specimen may be reconstructed using the disclosed semiconductor device.

Figure 1B:
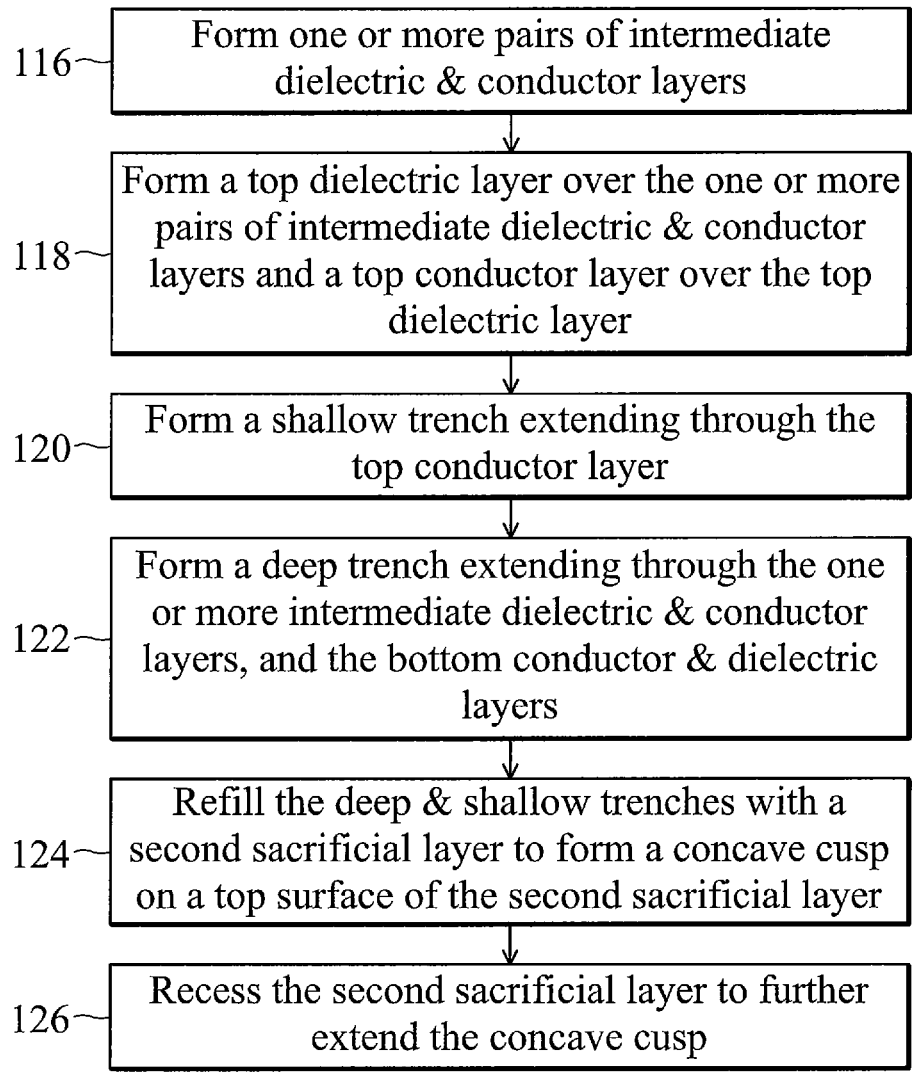
Figure 1C:
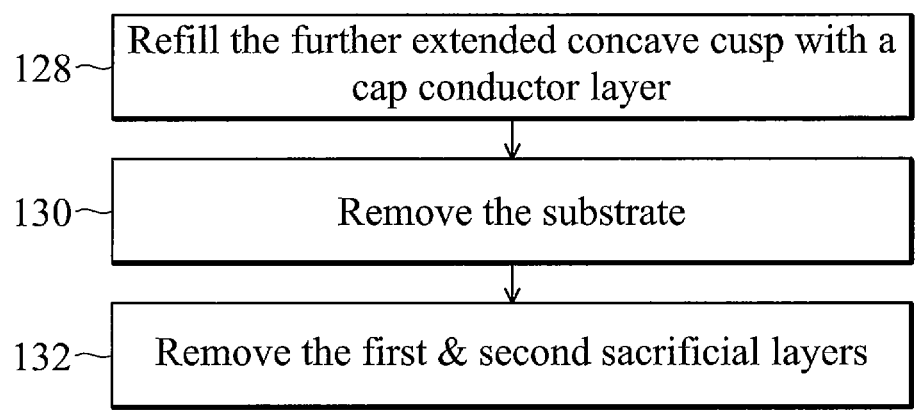

FIGS. 1A-1C illustrate a flowchart of a method 100 to form a semiconductor device according to one or more embodiments of the present disclosure. It is noted that the method 100 is merely an example, and is not intended to limit the present disclosure. In some embodiments, the semiconductor device is, at least part of, a topography reconstruction device. As employed by the present disclosure, the topography reconstruction device refers to any device/circuit/equipment that can provide a functionality of reconstructing a topography of a specimen. It is noted that the method of FIG. 1 does not produce a completed topography reconstruction device. A completed topography reconstruction device may be fabricated using complementary metal-oxide-semiconductor (CMOS) technology processing. Accordingly, it is understood that additional operations may be provided before, during, and after the method 100 of FIGS. 1A-1C, and that some other operations may only be briefly described herein.

Referring to FIG. 1A, in some embodiments, the method 100 starts with operation 102 in which a semiconductor substrate overlaid by a first sacrificial layer is provided. The method 100 continues to operation 104 in which a semiconductor layer is formed over the first sacrificial layer. The method 100 continues to operation 106 in which a lower portion of the semiconductor layer is doped with a first type of dopant. The method 100 continues to operation 108 in which an upper portion of the semiconductor layer is doped with a second type of dopant. In some embodiments, the first type has an opposite polarity to the second type, e.g., a p-type and an n-type. Further, in some embodiments, the upper portion is in contact with the lower portion such that a p-n junction is formed in the semiconductor layer. The method 100 continues to operation 110 in which plural photodetectors are formed on the first sacrificial layer. In some embodiments, the plural photodetectors are formed by patterning the semiconductor layer such that each photodetector is formed as a p-n junction diode that respectively includes part of the lower portion of the semiconductor layer and part of the upper portion of the semiconductor layer. Further, in some embodiments, the plural photodetectors are formed as a ring-like structure when viewed from the top. The method 100 continues to operation 112 in which a bottom dielectric layer is formed over the plural photodetectors. In some embodiments, the bottom dielectric layer may be further planarized by a polishing process (e.g., a chemical mechanical polishing (CMP) process). The method 100 continues to operation 114 in which a bottom conductor layer is formed over the bottom dielectric layer.

Referring to FIG. 1B, the method 100 continues to operation 116 in which one or more pairs of an intermediate dielectric layer and an intermediate conductor layer are formed over the bottom conductor layer. More specifically, in some embodiments, a respective intermediate dielectric layer of a first pair is formed over the bottom conductor layer and a respective intermediate conductor layer of the first pair is formed over the respective intermediate dielectric layer of the first pair and so on. Such one or more pairs of intermediate dielectric and conductor layers are disposed on top of one another. The method 100 continues to operation 118 in which a top dielectric layer is formed over a top one of the one or more intermediate conductor layer and a top conductor layer is formed over the top dielectric layer. The method 100 continues to operation 120 in which a shallow trench is formed to extend through the top conductor layer. The method 100 continues to operation 122 in which a deep trench is formed to extend through the one or more pairs of intermediate conductor and dielectric layers, the bottom conductor layer, and the bottom dielectric layer. In, some embodiments, the deep trench further extends downwardly from a central portion of the shallow trench so as to expose a top surface of the first sacrificial layer. The method 100 continues to operation 124 in which a second sacrificial layer is deposited to refill the deep and shallow trenches so as to form a concave cusp on a top surface of the second sacrificial layer. In some embodiments, the second sacrificial layer is formed of a substantially similar material as the first sacrificial layer such that in operation 124, the first and second sacrificial layers may be integrally formed as a one-piece structure. The method 100 continues to operation 126 in which the top surface of the second sacrificial layer, at least part of, is recessed to further extend the concave cusp downwardly.

Referring to FIG. 1C, the method 100 continues to operation 128 in which a cap conductor layer is deposited to refill the concave cusp so as to form a conductor tip in the concave cusp. The method 100 continues to operation 130 in which the semiconductor substrate is removed. The method 100 continues to operation 132 in which the first and second sacrificial layers are removed. In some embodiments, after the first and second sacrificial layers are removed, the deep trench and at least part of the shallow trench are exposed such that the conductor tip is exposed within the deep trench.

Figure 2A:
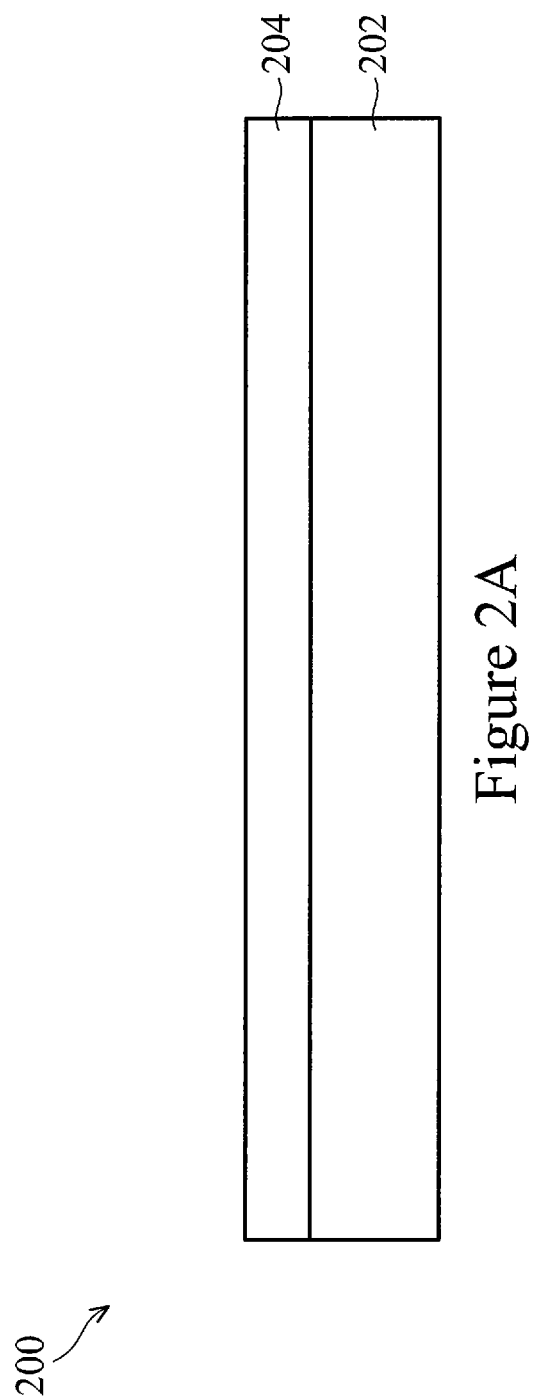
FIGS. 2A, 2B, 2C, 2D, 2E, 2F, 2G, 2H, 2I, 2J, 2K, 2L, 2M, 2N, 2O, and 2P illustrate cross-sectional views of an exemplary semiconductor device, made by the method of FIGS. 1A-1C, during various fabrication stages, in accordance with some embodiments.

In some embodiments, operations of the method 100 may, be associated with cross-sectional views of a semiconductor device 200 at various fabrication stages as shown in FIGS. 2A, 2B, 2C, 2D, 2E, 2F, 2G, 2H, 2I, 2J, 2K, 2L, 2M, 2N, 2O, and 2P, respectively. In some embodiments, the semiconductor device 200 may be a topography reconstruction device. The semiconductor device 200 may be included in a microprocessor, memory cell, and/or other integrated circuit (IC). Also, FIGS. 2A through 2P are simplified for a better understanding of the concepts of the present disclosure. For example, although the figures illustrate the topography reconstruction device 200, it is understood the IC may comprise a number of other devices comprising resistors, capacitors, inductors, fuses, etc., which are not shown in FIGS. 2A through 2P, for purposes of clarity of illustration.

Corresponding to operation 102 of FIG. 1A, FIG. 2A is a cross-sectional view of the topography reconstruction device 200 including a substrate 202 overlaid by a first sacrificial layer 204 at one of the various stages of fabrication, according to some embodiments. In some embodiments, the substrate 202 includes a silicon substrate. Alternatively, the substrate 202 may include other elementary semiconductor material such as, for example, germanium. The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In one embodiment, the substrate 202 includes an epitaxial layer. For example, the substrate may have an epitaxial layer overlying a bulk semiconductor. Furthermore, the substrate 202 may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

In some embodiments, the first sacrificial layer 204 may be formed of silicon oxide. The first sacrificial layer 204 may be formed using one or more deposition techniques such as, for example, a chemical vapor deposition (CVD) technique, a physical vapor deposition (PVD) technique, an atomic layer deposition (ALD) technique, or other suitable technique. In some embodiments, the first sacrificial layer 204 may be used as a sacrificial/dummy layer that will be removed in a later process, which will be discussed in further detail below.

Figure 2B:
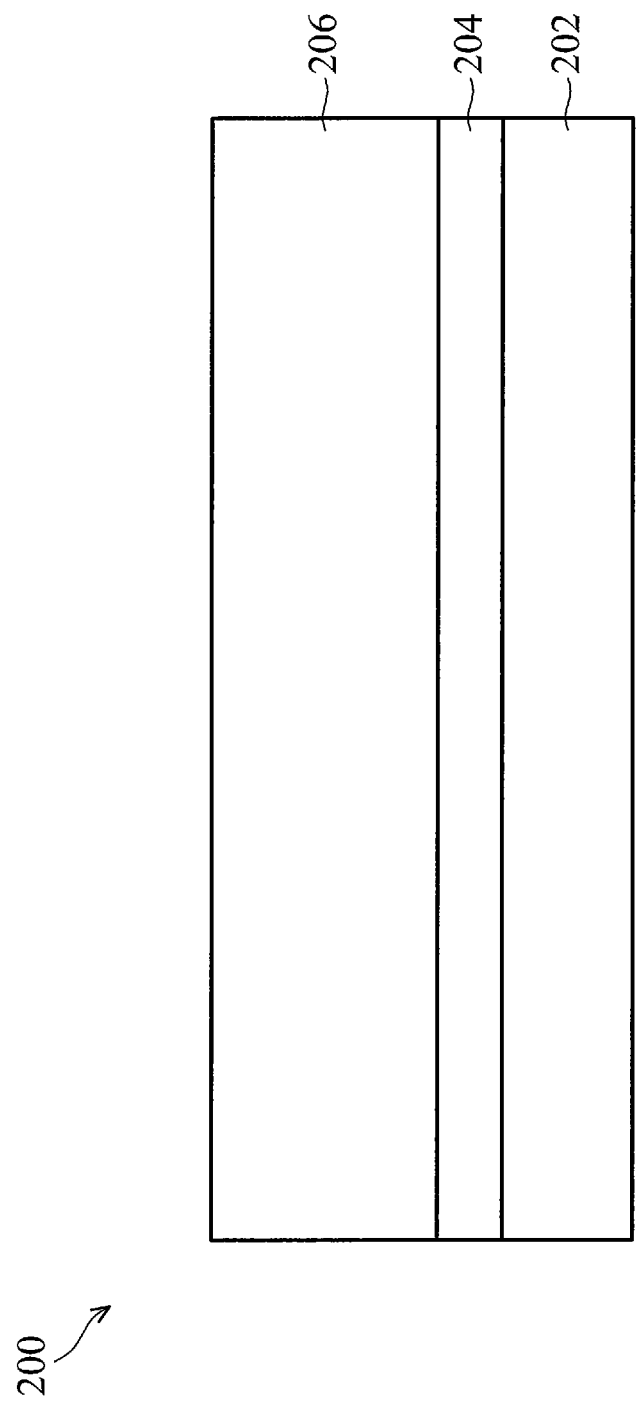

Corresponding to operation 104 of FIG. 1A, FIG. 2B is a cross-sectional view of the topography reconstruction device 200 including a semiconductor layer 206 formed over the first sacrificial layer 204 at one of the various stages of fabrication, according to some embodiments. In some embodiments, the semiconductor layer 206 is formed of crystalline silicon. Alternatively, the semiconductor layer 1206 may be formed of crystalline germanium, and/or III-V compound semiconductor materials (e.g., InAs, GaAs, GaN, InP, GaP, etc.). In some embodiments, the semiconductor layer 206 is formed using an epitaxial growth method, such as molecular beam epitaxy (MBE) or metalorganic vapor phase epitaxy (MOVPE). In some embodiments, the semiconductor layer 206 may be formed using one or more deposition techniques such as, for example, a CVD technique, a PVD technique, an ALD technique, or other suitable technique.

Figure 2C:
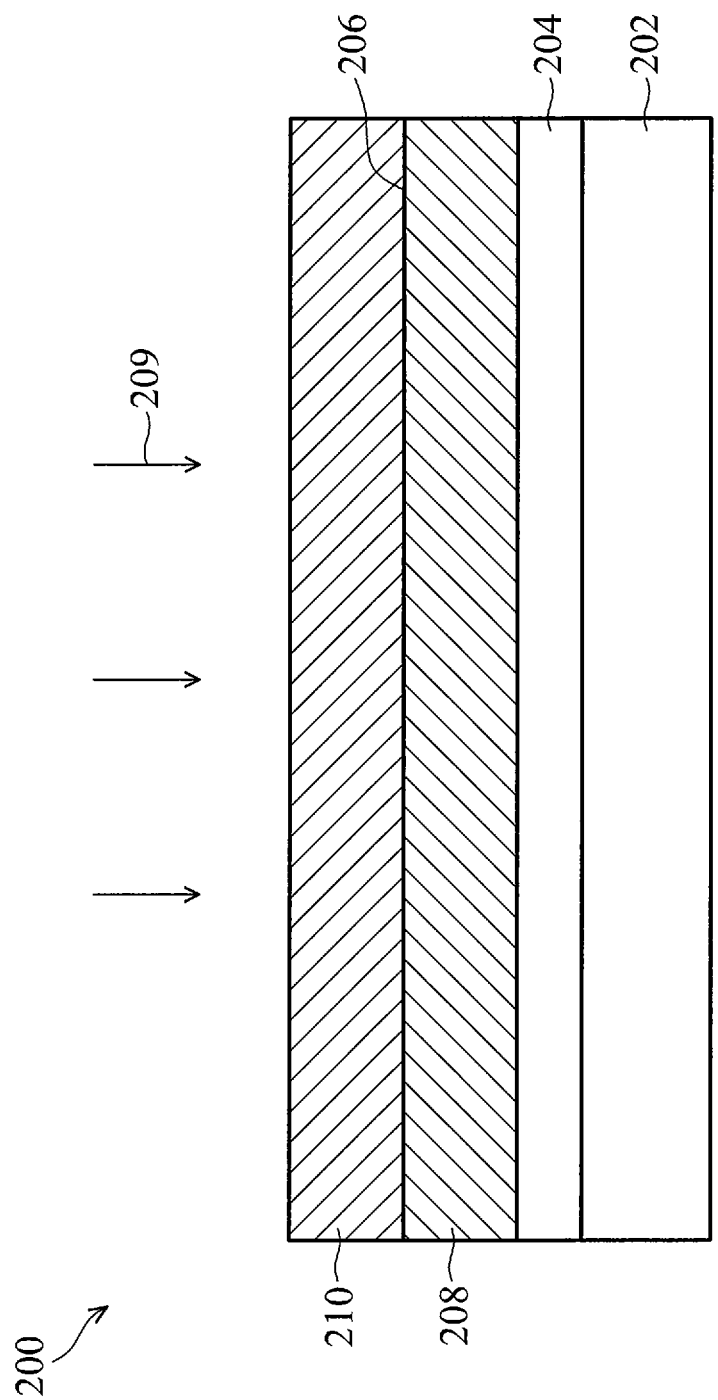

Corresponding to operation 106 of FIG. 1A, FIG. 2C is a cross-sectional view of the topography reconstruction device 200 including a lower portion 208 of the semiconductor layer 206 which is doped by a first doping process 209 at one of the various stages of fabrication, according to some embodiments. The first doping process 209 may include an ion implantation process that is generally used to incorporate a plurality of dopants into a semiconductor substrate. In the illustrated embodiment of FIG. 2C, the plurality of dopants, implanted by the first doping process 209, may include p-type dopants, e.g., boron, $BF_2$, and/or a combination thereof, and such dopants are implanted into the lower portion 208 of the semiconductor layer 206.

Figure 2D:
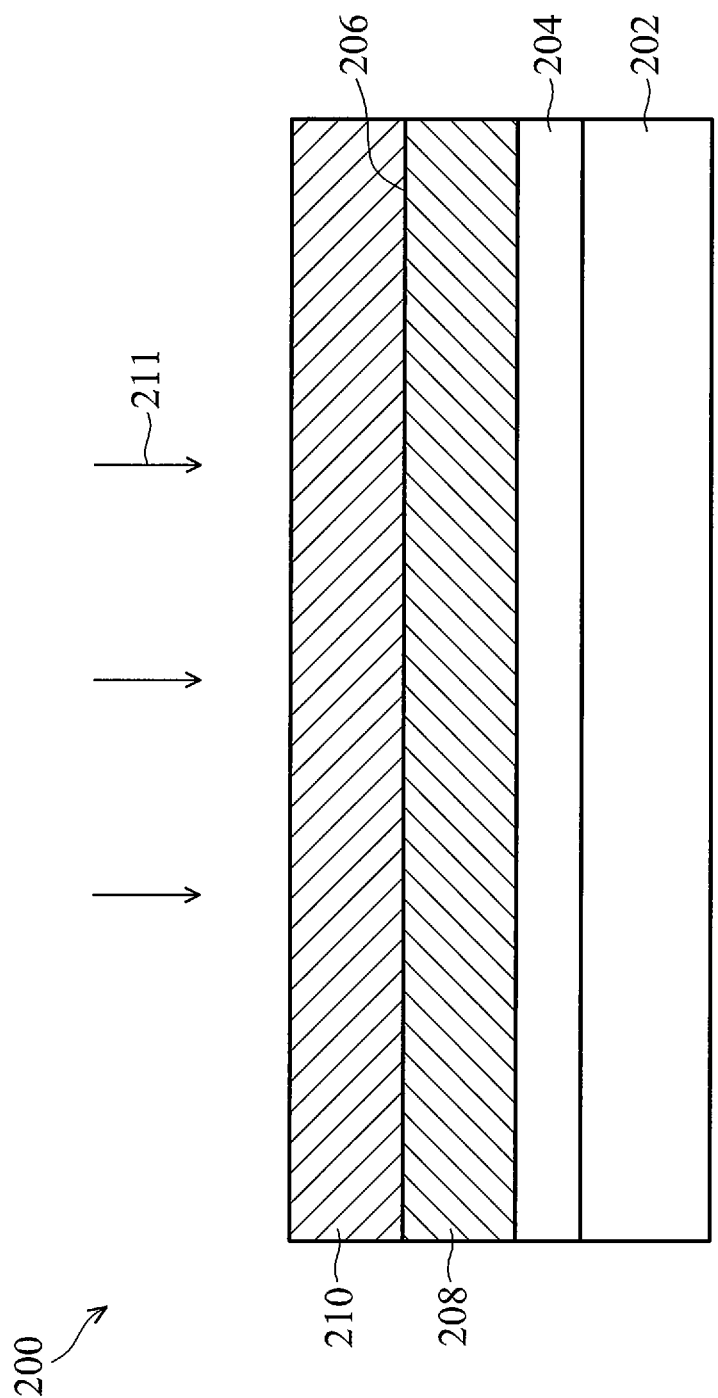

Corresponding to operation 108 of FIG. 1A, FIG. 2D is a cross-sectional view of the topography reconstruction device 200 including a higher portion 210 of the semiconductor layer 206 which is doped by a second doping process 211 at one of the various stages of fabrication, according to some embodiments. The second doping process 211 may also include the ion implantation process that incorporates a plurality of dopants into a semiconductor substrate. In the illustrated embodiment of FIG. 2D, the plurality of dopants, implanted by the second doping process 211, may include n-type dopants, e.g., phosphorus, arsenic, and/or a combination thereof, and such dopants are implanted into the higher portion 210 of the semiconductor layer 206.

In some embodiments, the lower portion 208 and the higher portion 210 may be in direct contact with each other such that the lower and higher portions (208 and 210) may form a p-n junction in the semiconductor layer 206. Although in the illustrated embodiments of FIGS. 2C and 2D, the lower portion 208 is doped with p-type dopants and the higher portion 210 is doped with n-type dopants, it is understood that polarities of dopants (i.e., n- or p-type) implanted into the lower and upper portions (208 and 210), respectively, may be reversed while remaining within the scope of the present disclosure.

Figure 2E:
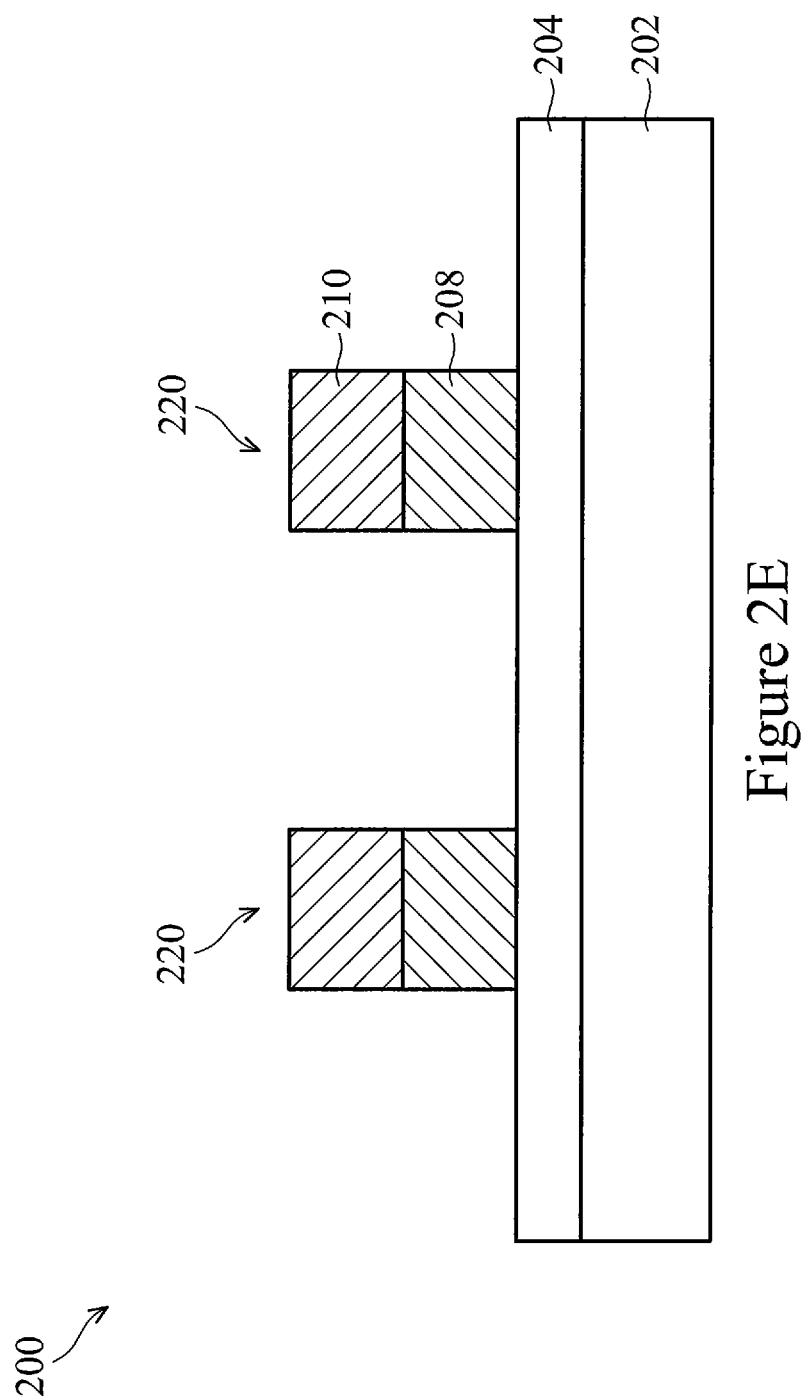

Corresponding to operation 110 of FIG. 1A, FIG. 2E is a cross-sectional view of the topography reconstruction device 200 including one or more photodetectors 220 which are formed at one of the various stages of fabrication, according to some embodiments. As shown, each of the one or more photodetectors 220 is formed by a portion of the lower portion 208 and a portion of the higher portion 210. As such, the photodetector 220 may include a p-n junction diode. In some embodiments, the one or more photodetectors 220 may be formed as a ring-like structure when viewed from the top, which will be illustrated in FIG. 3. Thus, it can be understood that the cross-sectional view shown in the illustrated embodiment of FIG. 2E includes two discrete photodetectors 220 spaced from each other.

In some embodiments, the one or more photodetectors 220 may be formed by at least some of the following process steps: forming a patterned mask layer over the semiconductor layer 206 (FIG. 2D) that includes a corresponding pattern (e.g., openings) aligned with respective positions of the to-be formed photodetectors 220; performing one or more dry/wet etching processes to etch the semiconductor layer 206 using the patterned mask layer as a mask; and removing the patterned mask layer.

Figure 2F:
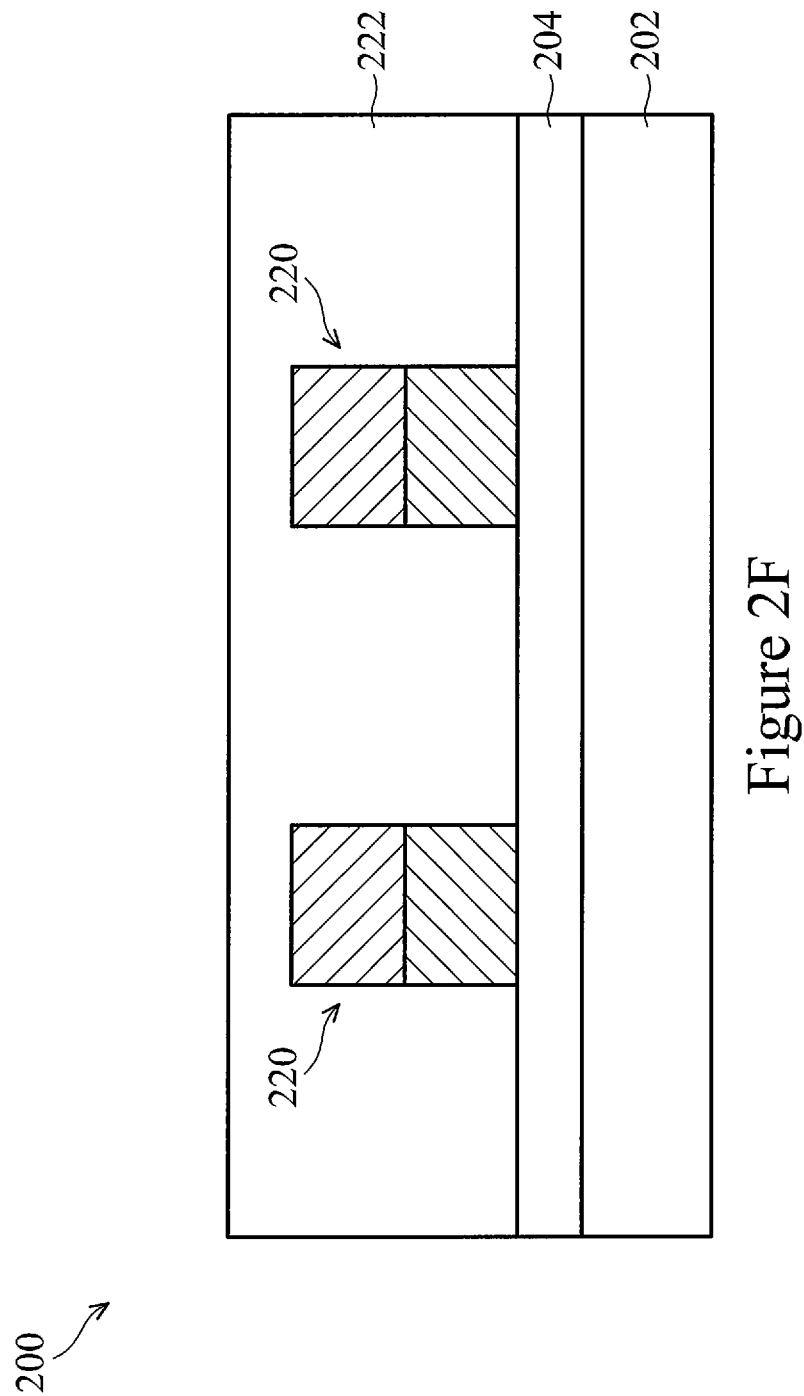

Corresponding to operation 112 of FIG. 1A, FIG. 2F is a cross-sectional view of the topography reconstruction device 200 including a bottom dielectric layer 222 overlaying the photodetectors 220 at one of the various stages of fabrication, according to some embodiments. The bottom dielectric layer 222 includes a material that is at least one of: a low dielectric constant (low-k) material, other suitable dielectric material, or a combination thereof.

The low-k material may include: silicon nitride (SiN), fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. Since the material of the bottom dielectric layer 222 will be used by other dielectric layers formed subsequently, for ease of discussion, the material is herein referred to as "material D."

In some embodiments, the bottom dielectric layer 222 is formed over the photodetectors 222 and the first sacrificial layer 204 by using one or more deposition techniques such as, for example, a CVD technique, a PVD technique, an ALD technique, or other suitable technique. And in some embodiments, a polishing process (e.g., a CMP process) may be performed to planarize the bottom dielectric layer 222.

Figure 2G:
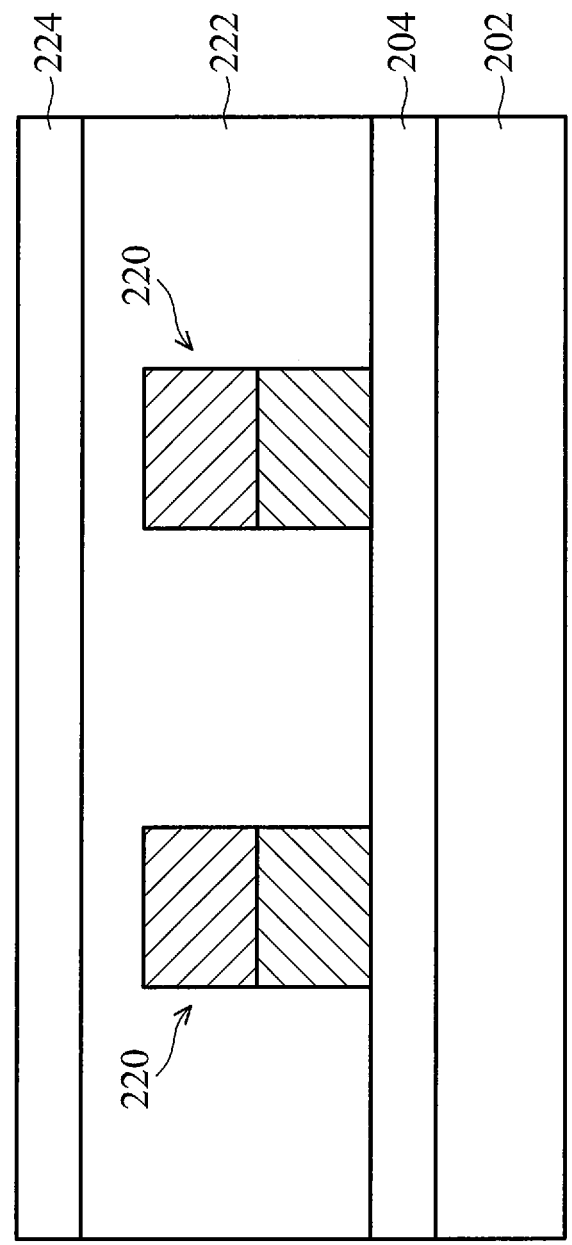

Corresponding to operation 114 of FIG. 1A, FIG. 2G is a cross-sectional view of the topography reconstruction device 200 including a bottom conductor layer 224 overlaying the bottom dielectric layer 222 at one of the various stages of fabrication, according to some embodiments. In some embodiments, the bottom conductor layer 224 is formed of a metal material such as, for example, copper (Cu).

In some other embodiments, the bottom conductor layer 224 may include other suitable metal materials (e.g., gold (Au), cobalt (Co), silver (Ag), etc.) and/or conductive materials (e.g., polysilicon) while remaining within the scope of the present disclosure. Similarly, since the material of the bottom conductor layer 224 will be used by other conductive structures/layers formed subsequently, for ease of discussion, the material is herein referred to as "material M." In some embodiments, the bottom conductor layer 224 may be formed by using a CVD technique, a PVD technique, a E-gun technique, a sputtering technique, and/or other suitable techniques to deposit the material M over the bottom dielectric layer 222.

Figure 2H:
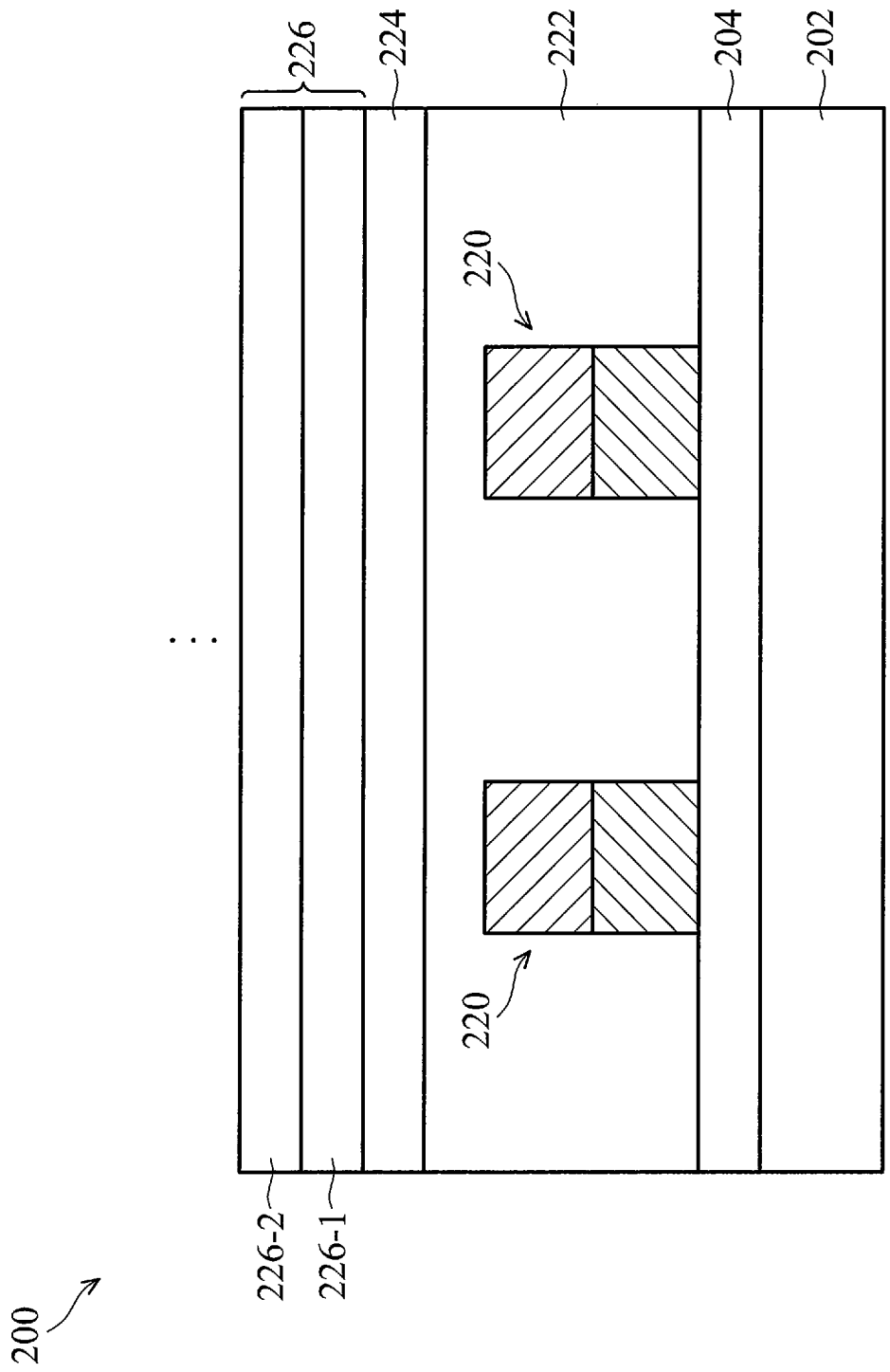

Corresponding to operation 116 of FIG. 1B, FIG. 2H is a cross-sectional view of the topography reconstruction device 200 including one or more pairs 226 of intermediate dielectric layer 226-1 and intermediate conductor layer 226-2 at one of the various stages of fabrication, according to some embodiments. In some embodiments, the intermediate dielectric layer 226-1 is formed of the "material D," and the intermediate conductor layer 226-2 is formed of the "material M." Although only one pair 226 of such intermediate layers are formed over the bottom conductor layer 224, it is understood that additional pair(s), each substantially similar to the pair 226 (i.e., a lower layer is a dielectric layer 226-1 and an upper layer is a conductor layer 226-2), can be formed over the first pair 226.

In some embodiments, the intermediate dielectric layer 226-1 may be formed by using a CVD technique, a PVD technique, and/or other suitable techniques to deposit the material D over the bottom conductor layer 224, and the intermediate conductor layer 226-2 may be subsequently formed by using a CVD technique, a PVD technique, a E-gun technique, a sputtering technique, and/or other suitable techniques to deposit the material M over the intermediate dielectric layer 226-1. When there are more additional pairs of intermediate dielectric and conductor layers formed over the pair 226, each of the additional pairs may be formed using the above-described approach.

Figure 2I:
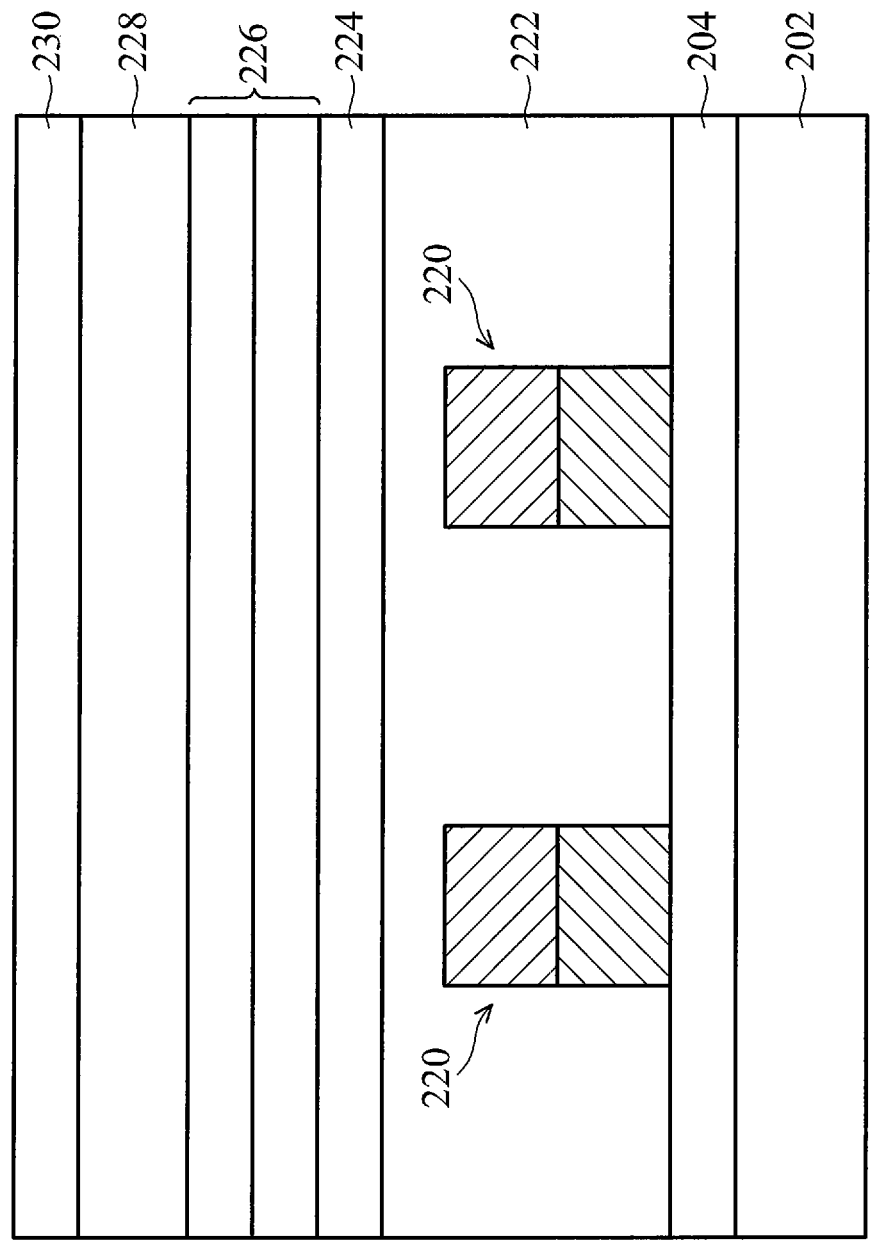

Corresponding to operation 118 of FIG. 1B, FIG. 2I is a cross-sectional view of the topography reconstruction device 200 including a top dielectric layer 228 overlaying the pair 226 and a top conductor layer 230 overlaying the top dielectric layer 228 at one of the various stages of fabrication, according to some embodiments. In some embodiments, the top dielectric layer 228 is formed of the "material D," and the top conductor layer 230 is formed of the "material M." In some embodiments, the top dielectric layer 228 may be formed by using a CVD technique, a PVD technique, and/or other suitable techniques to deposit the material D over the pair 226, and the top conductor layer 230 may be subsequently formed by using a CVD technique, a PVD technique, a E-gun technique, a sputtering technique, and/or other suitable techniques to deposit the material M over the top dielectric layer 228.

Figure 2J:
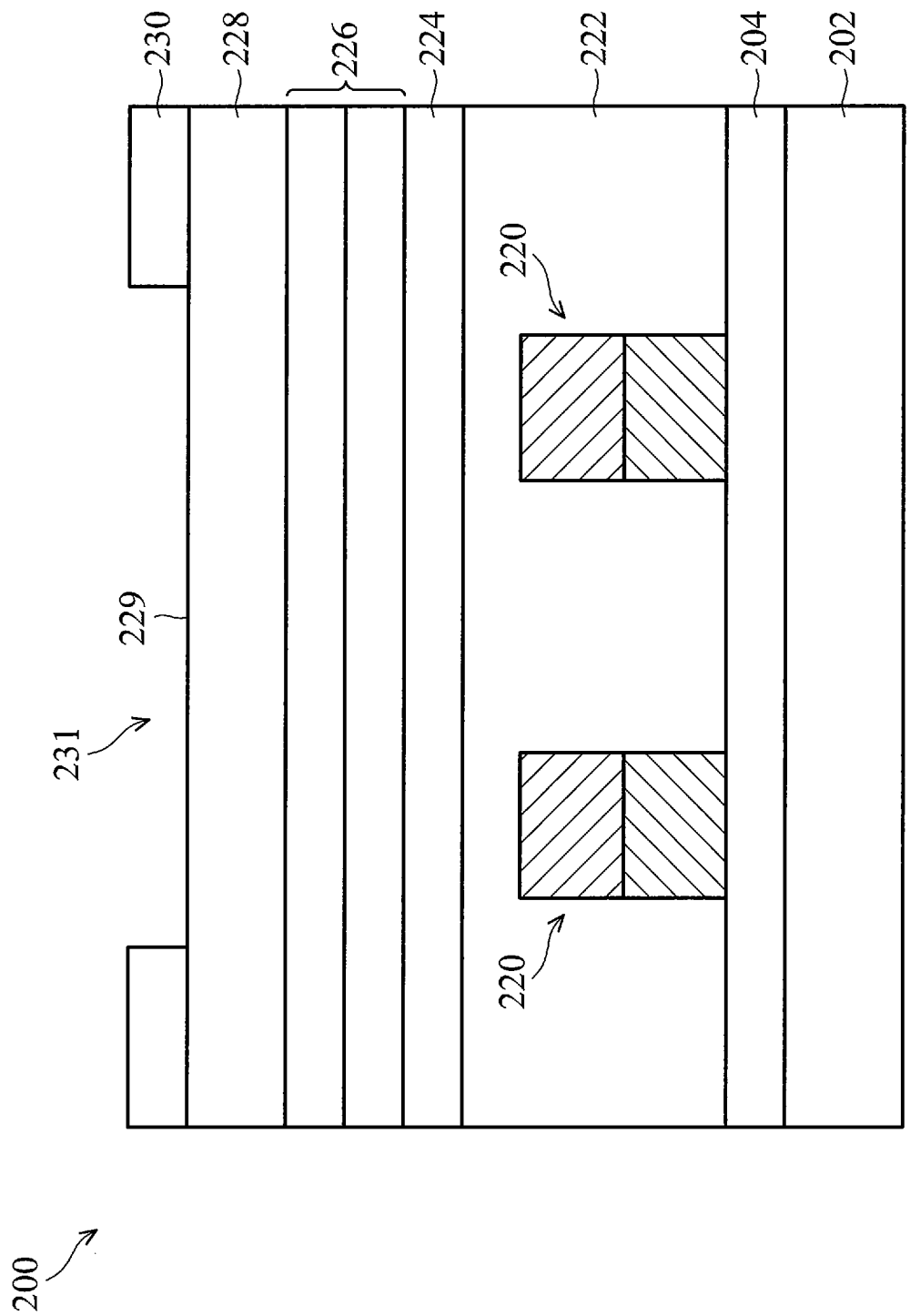

Corresponding to operation 120 of FIG. 1B, FIG. 2J is a cross-sectional view of the topography reconstruction device 200 including a shallow trench 231 which is formed at one of the various stages of fabrication, according to some embodiments. As shown, the shallow trench 231 is formed in the top conductor layer 230, and more specifically, the shallow trench 231 extends through the top conductor layer 230. Accordingly, a portion of a top surface 229 of the top dielectric layer 228 may be exposed.

In some embodiments, the shallow trench 231 may be formed by at least some of the following process steps: forming a patterned mask layer over the top conductor layer 230 (FIG. 2I) that includes a corresponding pattern (e.g., an opening) aligned with a respective position of the to-be formed shallow trench 231; performing one or more dry/wet etching processes to etch the top conductor layer 230 using the patterned mask layer as a mask; and removing the patterned mask layer.

Figure 2K:
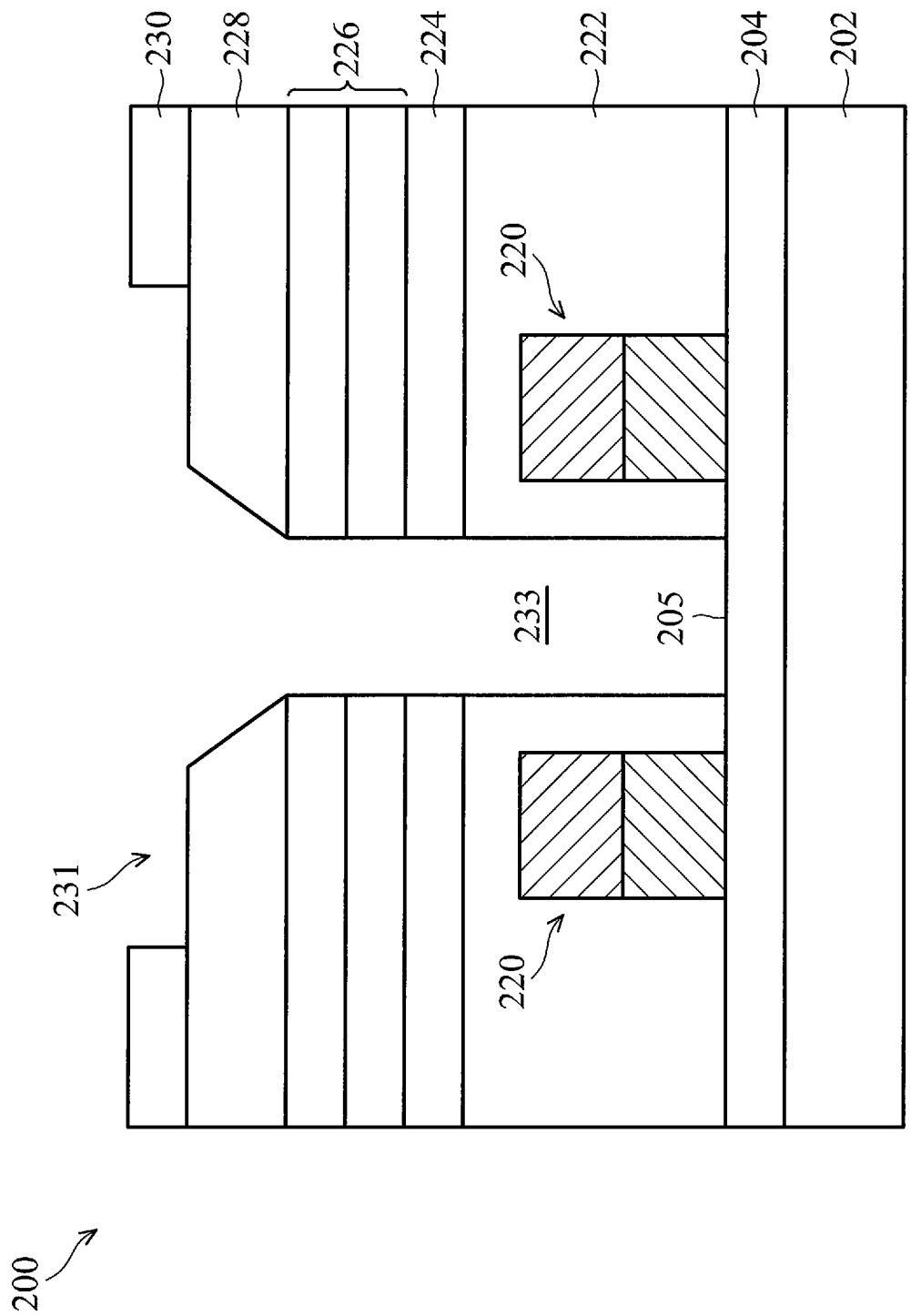

Corresponding to operation 122 of FIG. 1B, FIG. 2K is a cross-sectional view of the topography reconstruction device 200 including a deep trench 233 which is formed at one of the various stages of fabrication, according to some embodiments. As shown, the deep trench 233 is formed to further extend the shallow trench 231 downwardly, and more specifically, the deep trench 233 extends through the top dielectric layer 228, the one or more pairs 226, the bottom conductor layer 224, and the bottom dielectric layer 222. Accordingly, after the deep trench 233 is formed, respective sidewalls of the top dielectric layer 228, the one or more pairs 226, the bottom conductor layer 224, and the bottom dielectric layer 222, and a portion of a top surface 205 of the first sacrificial layer 204 may be respectively exposed.

Further, as shown in FIG. 2K, the deep trench 233 may be formed to be surrounded by the ring-like photodetectors 220, in accordance with some embodiments. As such, in some embodiments, the deep trench 233 may be formed as hollow cylinder with a curvilinear cross-section (e.g., a circle).

In some embodiments, the deep trench 233 may be formed by at least some of the following process steps: forming a patterned mask layer over the top dielectric layer 228 and the top conductor layer 230 (FIG. 2J) that includes a corresponding pattern (e.g., an opening) aligned with a respective position of the to-be formed deep trench 233; performing one or more dry/wet etching processes to, respectively or concurrently, etch the top dielectric layer 228, the one or more pairs 226, the bottom conductor layer 224, and the bottom dielectric layer 222 using the patterned mask layer as a mask; and removing the patterned mask layer.

Figure 2L:
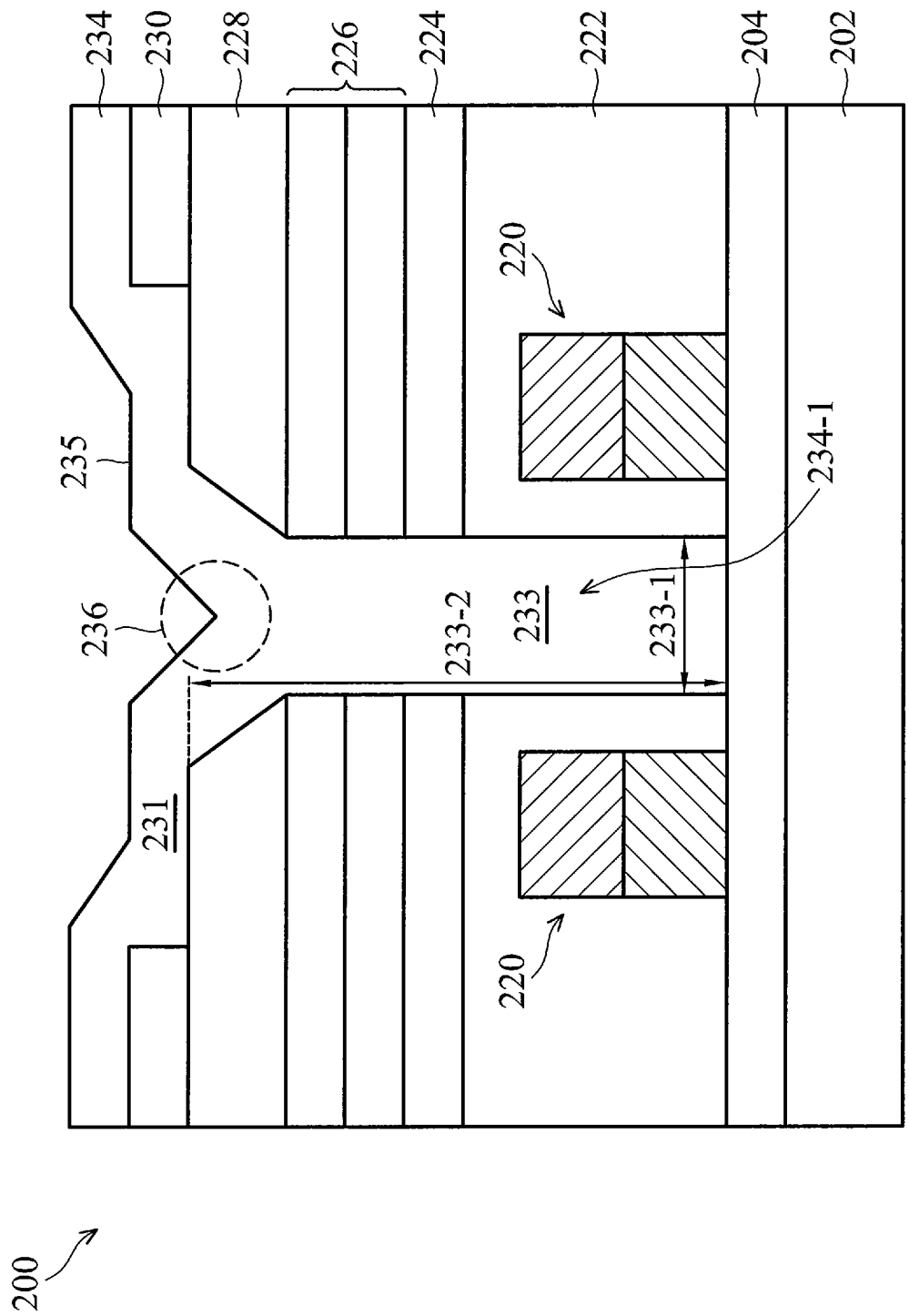

Corresponding to operation 124 of FIG. 1B, FIG. 2L is a cross-sectional view of the topography reconstruction device 200 including a second sacrificial layer 234 at one of the various stages of fabrication, according to some embodiments. As shown, the second sacrificial layer 234 is formed to refill the deep trench 233 and the shallow trench 231, and overlay the top conductor layer 230.

Due to a substantially high aspect ratio (a ratio of a depth 233-2 of the deep trench 233 to a width (or diameter) 233-1 of the deep trench 233) of the deep trench 233, when the deep trench 233 is refilled with the second sacrificial layer 234, a concave cusp 236 may be formed at a central portion of a top surface 235 of the second sacrificial layer 234, according to some embodiments. In some embodiments, the width 233-1 may range between about 10 nanometers (nm) to about 30 nm, and the depth 233-2 may range between about 40 nm to about 100 nm. Also, as mentioned above with respect to FIG. 2K, the deep trench 233 is formed as hollow cylinder with a curvilinear cross-section. As such, after the deep trench 233 is refilled by the second sacrificial layer 234, a lower portion 234' of the second sacrificial layer 234 that is defined by the diameter 233-1 and the depth 233-2 may be formed as a cylinder-like structure with a curvilinear cross-section.

In some embodiments, the second sacrificial layer 234 may be formed of a material that is substantially similar to the material of the first sacrificial layer 204, i.e., silicon oxide. As such, after the second sacrificial layer 234 is formed, the first and second sacrificial layers (204 and 234) may be integrally formed as a one-piece structure. In some embodiments, the second sacrificial layer 234 may be formed using one or more deposition techniques such as, for example, a CVD technique, a PVD technique, an ALD technique, or other suitable technique. In some embodiments, such a one-piece structure formed by the first and second sacrificial layers (204 and 234) may be used as a sacrificial/dummy layer that will be removed in a later process, which will be discussed in further detail below.

Figure 2M:
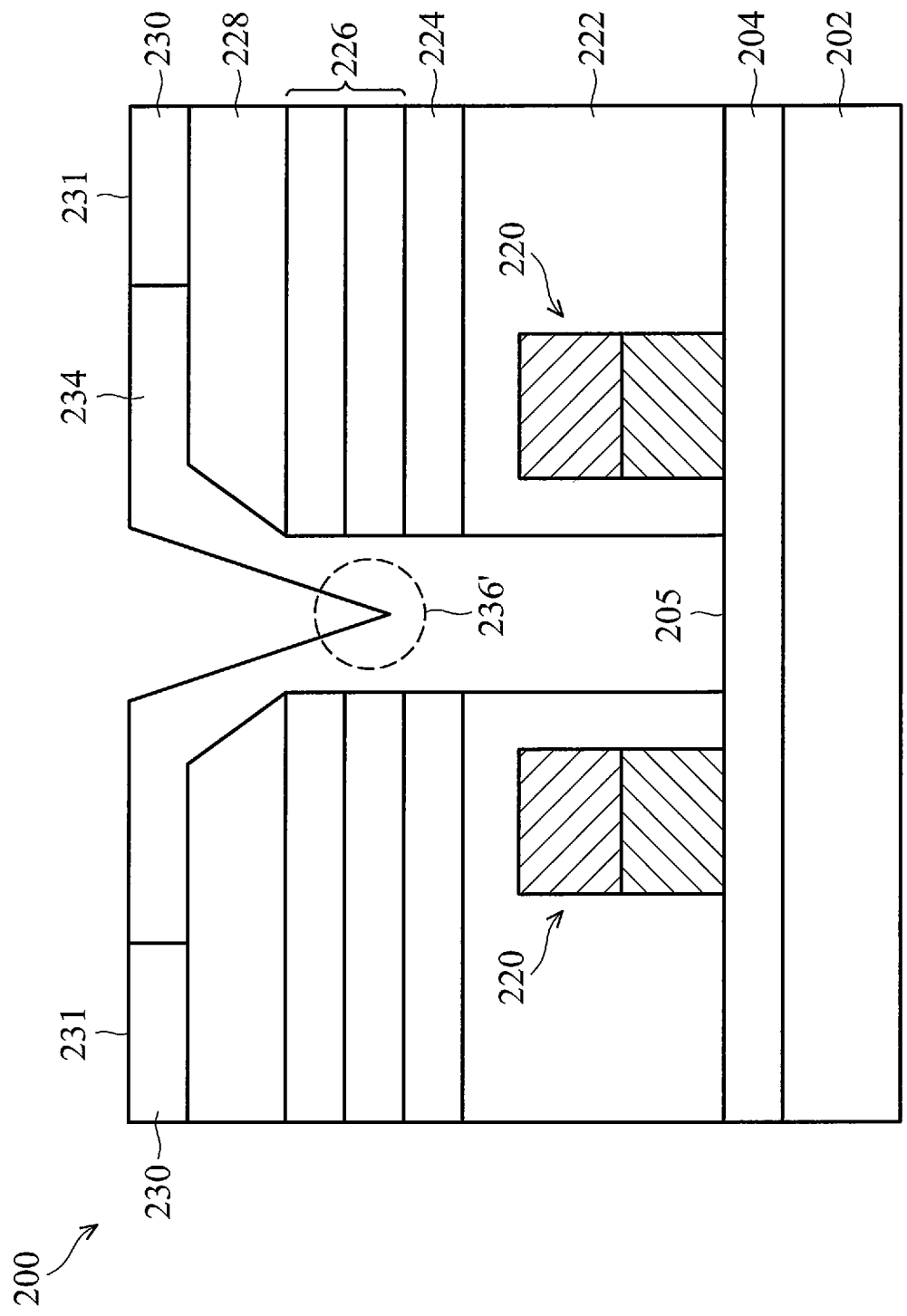

Corresponding to operation 126 of FIG. 1B, FIG. 2M is a cross-sectional view of the topography reconstruction device 200 including a further extended concave cusp 236' at one of the various stages of fabrication, according to some embodiments. In some embodiments, the further extended concave cusp 236', or simply the concave cusp 236', may be formed by performing one or more dry/wet etching process on the top surface 235 of the second sacrificial layer 234. As such, the concave cusp 236' may further extend downwardly (i.e., toward the top surface 205). In some embodiments, when the further extended cusp 236' is formed, a top surface 231 of the top conductor layer 230 may be exposed as well.

Figure 2N:
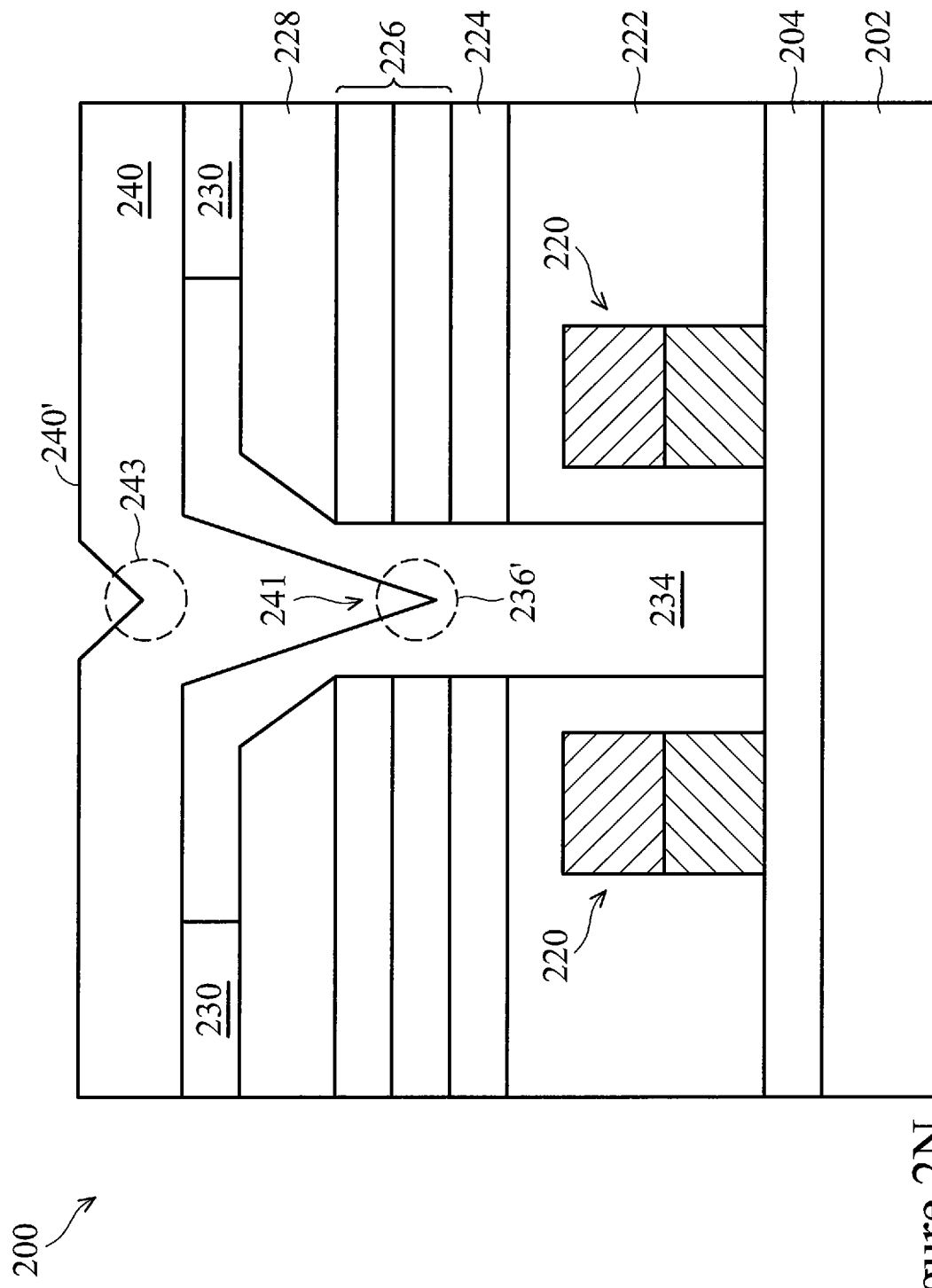

Corresponding to operation 128 of FIG. 1C, FIG. 2N is a cross-sectional view of the topography reconstruction device 200 including a cap conductor layer 240 which is formed at one of the various stages of fabrication, according to some embodiments. As shown, the cap conductor layer 240 is formed to overlay the top conductor layer 230 and the second sacrificial layer 234, which allows the cap conductor layer 240 to refill the concave cusp 236'. In other words, after the concave cusp 236' is refilled by, at least part of, the cap conductor layer 240, a conductor tip 241 that is formed of the same material as the cap conductor layer 240 may be formed. In a further embodiment, since the cap conductor layer 240 is formed to have a substantially conformal thickness, another concave cusp 243 may be formed on a top surface 240' of the cap conductor layer 240 after the formation of the cap conductor layer 240.

In some embodiments, the cap conductor layer 240 is formed of a different metal material than the "material M." In some embodiments, the cap conductor layer 240 may be formed of a metal material that has at least some of the following characteristics: a low potential barrier, and a high melting point. In a non-limiting example, the cap conductor layer 240 may be formed of tungsten (W). In some embodiments, the cap conductor layer 240 may be formed by using a CVD technique, a PVD technique, a E-gun technique, a sputtering technique, and/or other suitable techniques to deposit the above-described metal material (e.g., W) over the top conductor layer 230 and the second sacrificial layer 234.

Figure 2O:
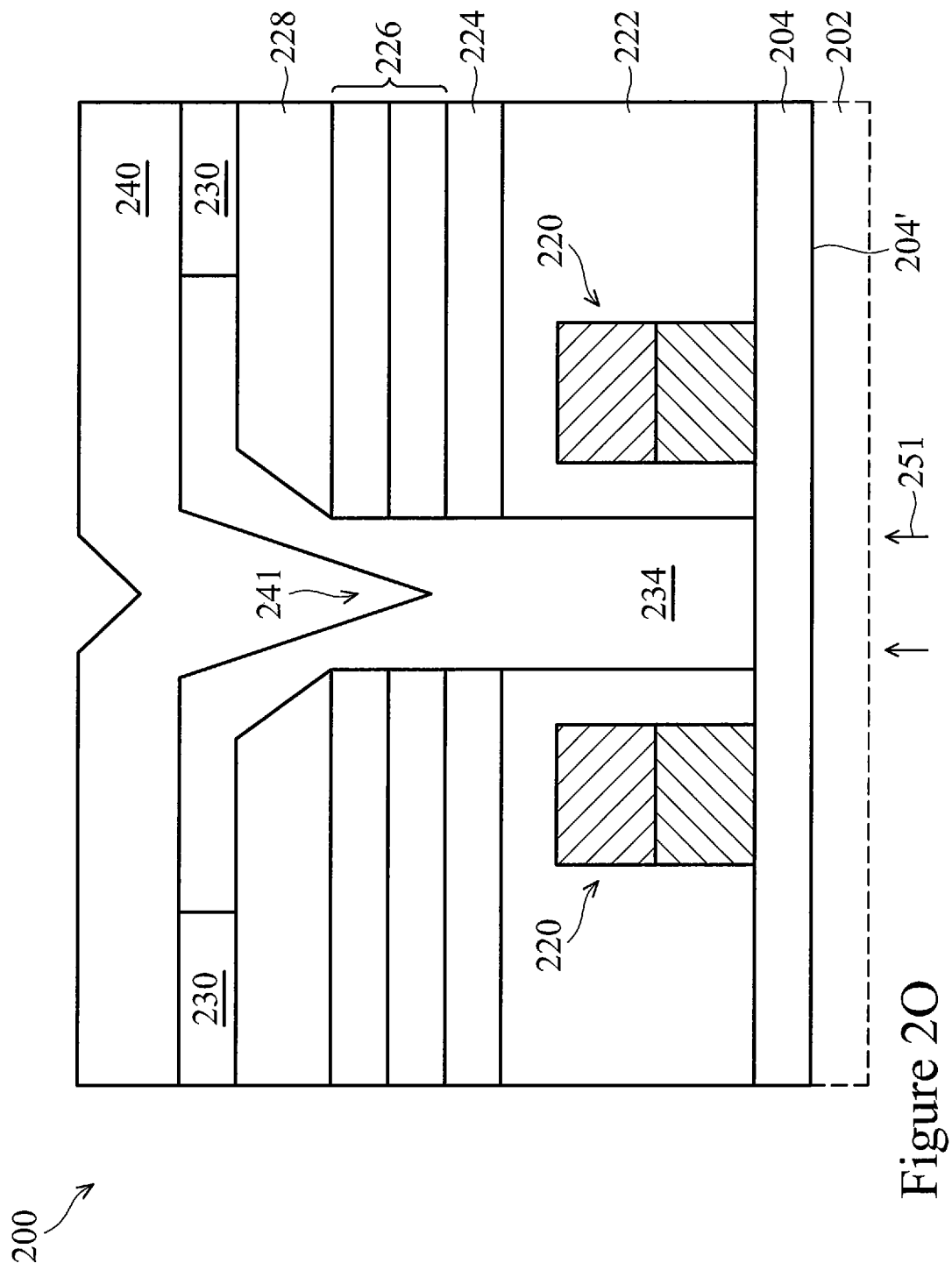
Figure 2P:
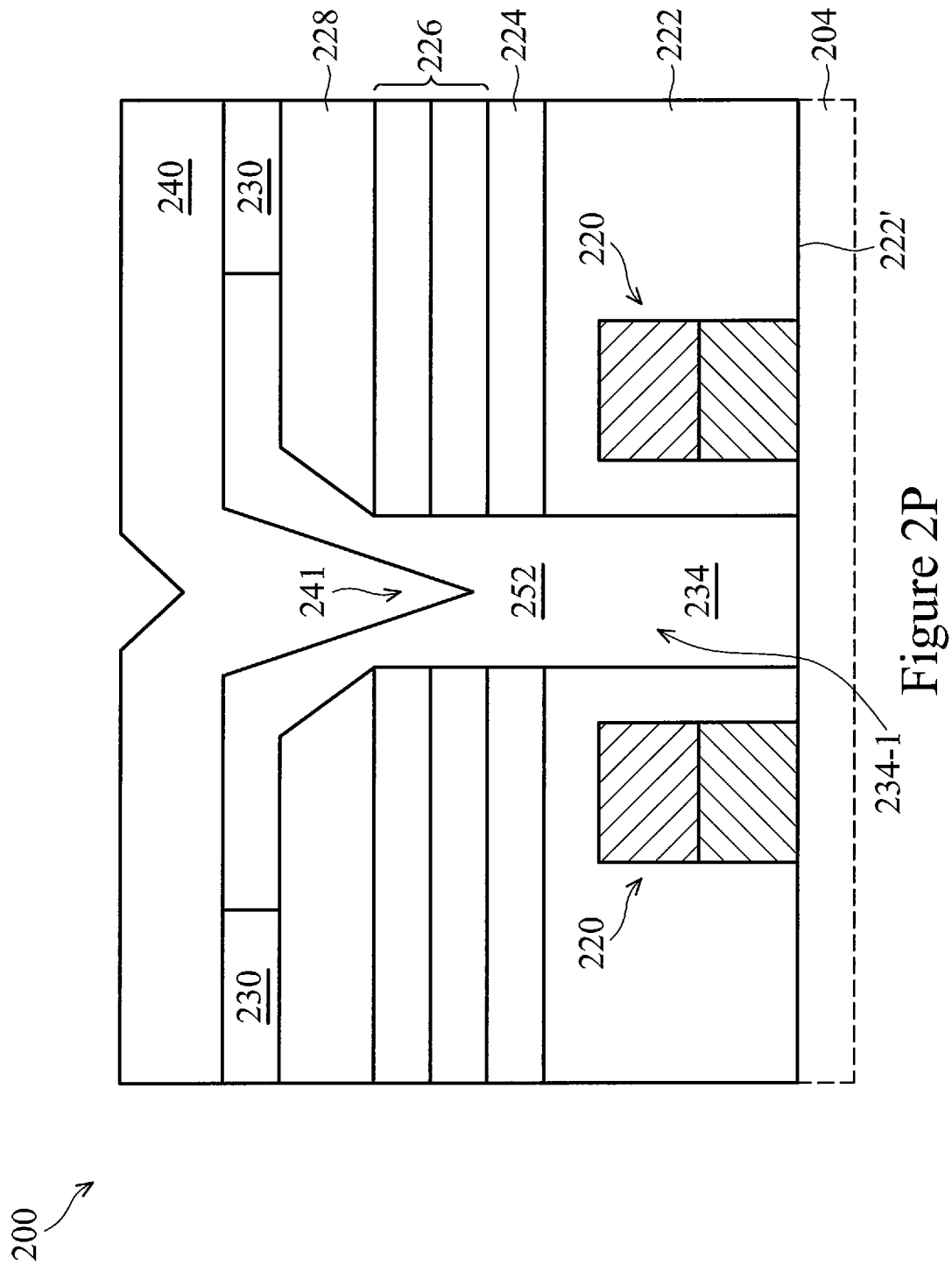

Corresponding to operation 130 of FIG. 1C, FIG. 2O is a cross-sectional view of the topography reconstruction device 200 after the substrate 202 (shown in dotted line) is removed at one of the various stages of fabrication, according to some embodiments. In some embodiments, the substrate 202 may be removed by at least some of the following processes: rotating the topography reconstruction device 200 upside down; and performing a polishing process (e.g., a CMP process) 251 on the substrate 202 until a backside surface 204' of the first sacrificial layer 204 is exposed; and performing one or more cleaning processes.

Corresponding to operation 132 of FIG. 1C, FIG. 2P is a cross-sectional view of the topography reconstruction device 200 after the first and second sacrificial layers 204 and 234 (shown in dotted line) are concurrently removed at one of the various stages of fabrication, according to some embodiments. As mentioned above, in some embodiments, the first and second sacrificial layers 204 and 234 are formed of a same material (e.g., silicon oxide), in which case, the first and second sacrificial layers 204 and 234 are integrally formed as a one-piece structure. Accordingly, in some embodiments, such a one-piece structure (formed by the first and second sacrificial layers 204 and 234) may be concurrently removed (e.g., selectively etched) using one or more acid solutions, for example, diluted hydrofluoric acid (HF), while remaining other layers/structures (e.g., 220, 222, 224, 226, 228, 230, 240, and 241) intact.

In some embodiments, after the removal of the first and second sacrificial layers 204 and 234, a hollow space 252 that was occupied by the second sacrificial layer 234 is formed. More specifically, as mentioned above with respect to FIG. 2L, the lower portion 234-1 of the second sacrificial layer 234 is formed of a cylinder-like structure such that a corresponding portion of the hollow space 252 may be formed as a hollow cylinder-like space, and, in some embodiments, the conductor tip 241 is formed within such a hollow cylinder-like space 252 (e.g., a central hole of the semiconductor device 200). When viewed from the bottom, the conductor tip 241 may be surrounded by a tube that is at least formed by the bottom dielectric layer 222, the bottom conductor layer 224, the one or more pairs of intermediate dielectric layers and intermediate conductor layers 226, the top dielectric layer 228, and the top conductor layer 230. Further, in some embodiments, the photodetectors 220 are formed as a ring-like structure in the bottom dielectric layer 222, as mentioned above. As such, when viewed form the bottom, the photodetectors 220, which are exposed at a respective bottom surface 222' of the tube, may surround the conductor tip 241 as a ring. For purposes of clarity, the above-described tube and the conductor tip 241 (which is part of the cap conductor layer 240) are collectively referred to herein as the topography reconstruction device 200.

Figure 3:
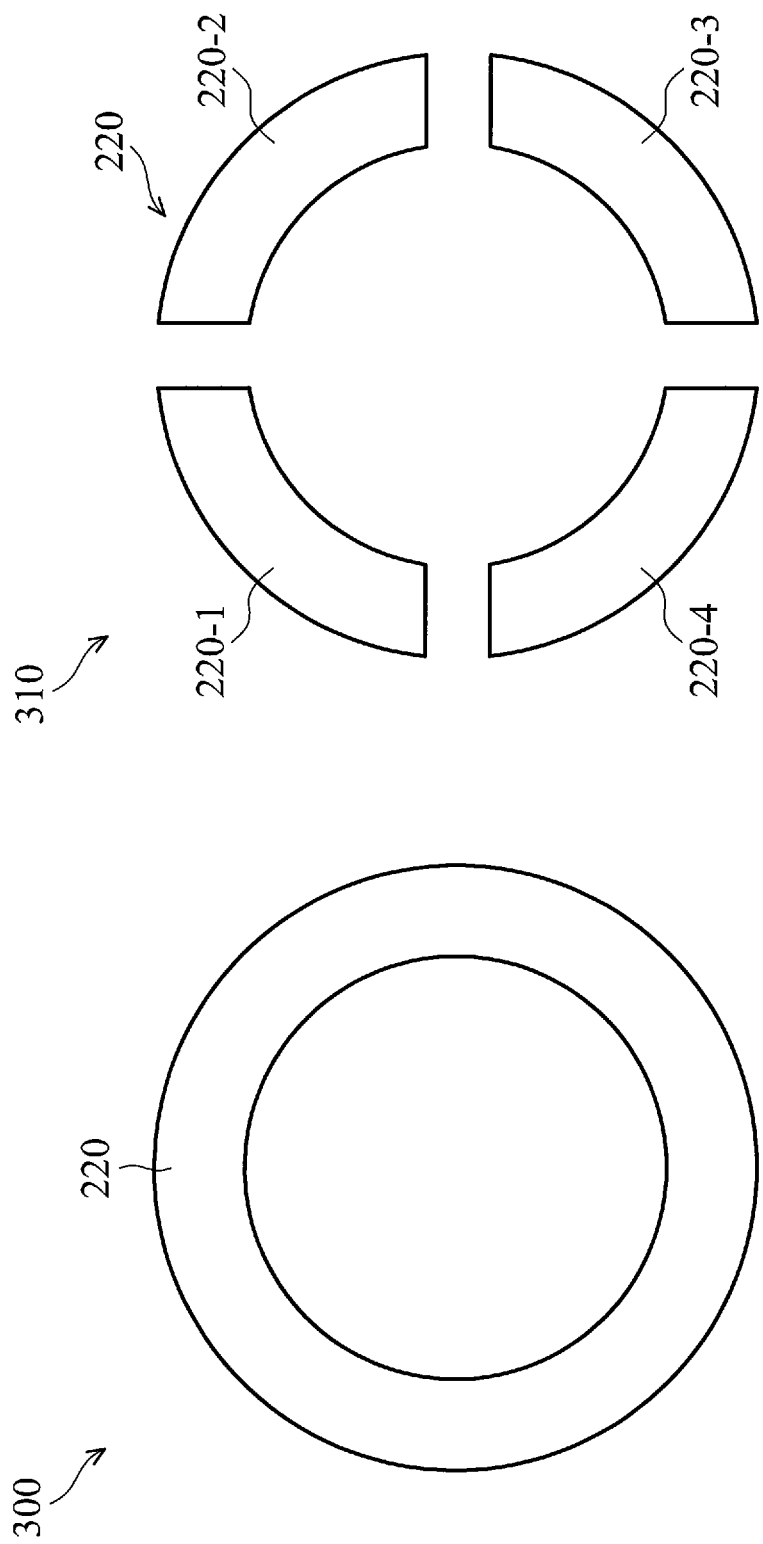
FIG. 3 illustrates exemplary configurations of photodetectors of the semiconductor device made by the method of FIGS. 1A-1C, in accordance with some embodiments.

FIG. 3 illustrates some exemplary configurations 300 and 310 of the photodetectors 220, when viewed from the top, in accordance with various embodiments. In the above discussions of the photodetectors 220, in some embodiments, the photodetectors 220 may be formed as a ring-like structure. In 300, the photodetectors 220 may be formed as a continuous ring-like structure, and in 310, the photodetectors 220 may be each formed as a respective segment (e.g., 220-1, 220-2, 220-3, 220-4, etc.) of a ring-like structure.

Although the illustrated embodiment 310 shows that each photodetector (i.e., 2201-1, 220-2, 220-3, and 220-4) constitutes a quadrant of a respective ring-like structure, it is understood that the photodetectors 220 may be each formed as any shape of a circular sector (e.g., a sextant, an octant, etc.) of a respective ring-like structure while remaining within the scope of the present disclosure. In some embodiments, forming each of the photodetectors 220 as a discrete circular sector, as shown in 310, may provide various advantages when using the topography reconstruction device 200 as part of a topography reconstruction circuit, which will be discussed in further detail below.

Figure 4:
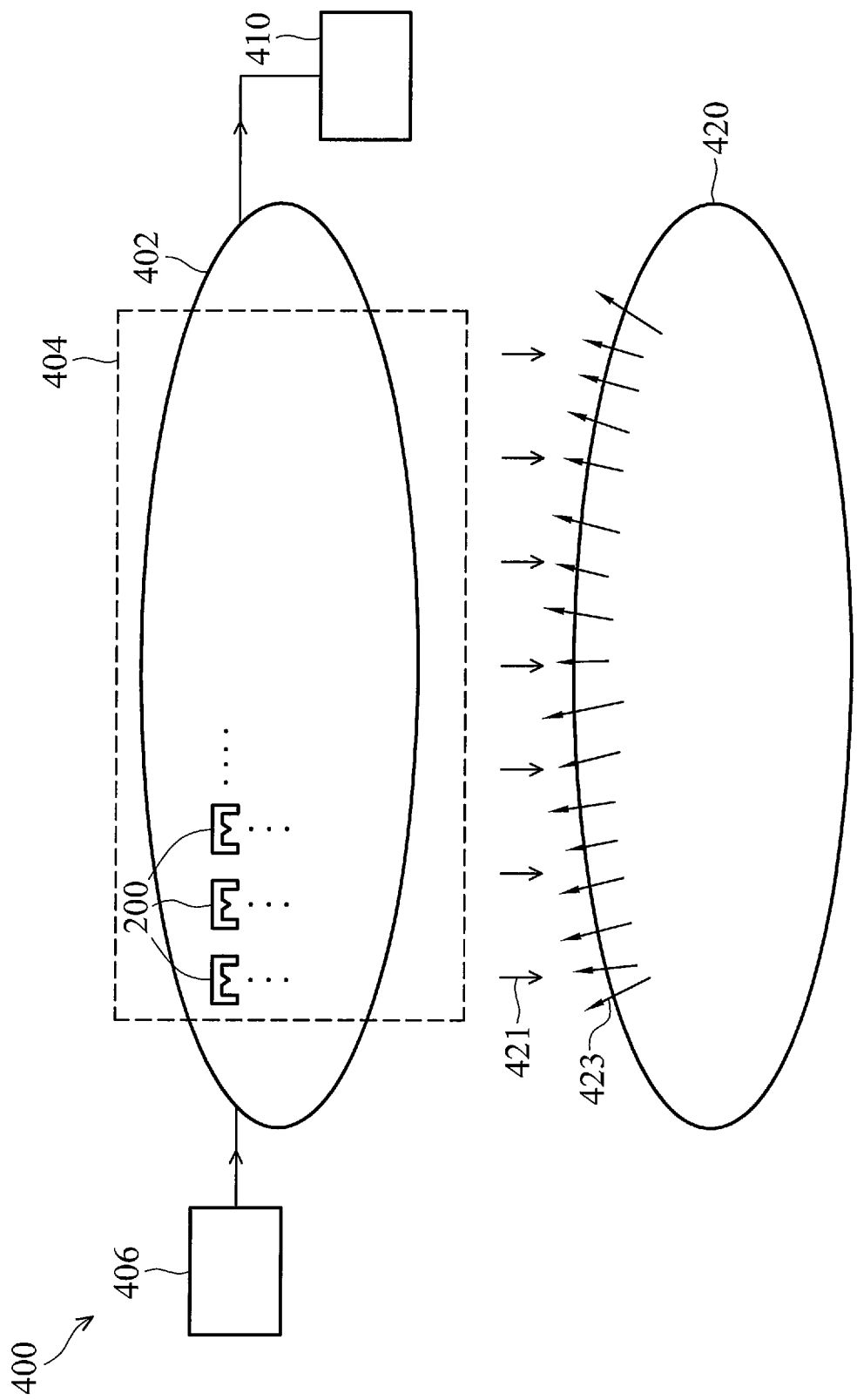
FIG. 4 illustrates an exemplary block diagram of a topography reconstruction circuit that includes plural semiconductor devices made by the method of FIGS. 1A-1C, in accordance with some embodiments.

FIG. 4 illustrates a block diagram of an exemplary topography reconstruction circuit 400, in accordance with various embodiments. As shown, the topography reconstruction circuit 400 includes a substrate 402 having an array 404 of a plurality of topography reconstruction device 200 made by the above-discussed method (FIGS. 1A-1C), a voltage/current (VC) generation unit 406, and a control unit 410. Thus, for purposes of discussion, the following embodiment of the topography reconstruction circuit 400 will be described in conjunction with the method in FIGS. 1A-1C, and corresponding cross-sectional views of the topography reconstruction device 200 in 2A-2P.

In some embodiments, each of the topography reconstruction device 200 of the array 404 is coupled to the VC generation unit 406, and configured to receive a voltage signal and a current signal from the VC generation unit 406. More specifically, the VC generation unit 406 is configured to provide a high voltage signal to the respective conductor tip 241 (through the cap conductor layer 240) of each of the topography reconstruction device 200, and provide a current signal to flow through the respective bottom conductor layer 224 and the one or more intermediate conductor layers 226-2.

When such a high voltage signal is applied to the conductor tip 241, due to the characteristics of W (tungsten) and other metal materials having similar characteristics as discussed above, one or more electrons (e.g., 421) may be emitted from the conductor tip 241. Moreover, when the current signal flows through the bottom conductor layer 224 and the one or more intermediate conductor layers 226-2. Such a multi-layer of conductors (i.e., 224, and plural 226-2) may function as an electron aperture that can focus (i.e., guide) the electron 421 emitted from the conductor tip 421, which allows the electron 421 to travel along a direction substantially perpendicular to a respective surface of a to-be examined specimen 420 (e.g., an IC). As such, once the topography reconstruction devices 200 are disposed at respective positions on the substrate 402, an electron emitted from each topography reconstruction devices 200 can be well guided and won't interfere with electrons emitted from other topography reconstruction devices 200.

In some embodiments, once the electrons 421 are emitted from respective topography reconstruction devices 200, the electrons 421 may hit the top surface of the specimen 420, and based on a respective topography of the specimen 420, plural electrons 423 (typically referred to as "second electrons") may be back-scattered from the specimen 420. In some embodiments, such back-scatter electrons 423 can be collected by the respective photodetectors 220 of the topography reconstruction devices 200. When each topography reconstruction devices 200 collects a respective portion of the back-scattered electrons 423, the topography reconstruction device 200 may provide the respective portion of the electrons 423 to the control unit 410 as a respective input signal. In some embodiments, the control unit 410 may use one or more commercially available image processing tools, for example, Mountain Map from Digital Surf (Besancon, France), 3D GUI form Applied Materials (Santa Clara, Calif.) etc., to reconstruct a respective surface topography of the specimen 420.

As mentioned above with respect to 310 of FIG. 3, the photodetectors 220 of each topography reconstruction devices 200 may be formed as respective segments of a ring-like structure. When the photodetector 220 is formed as a discrete segment, each of the photodetectors 220 may individually collect a respective portion of the back-scattered electrons 423, which may in turn increase a resolution of the reconstructed surface topography of the specimen 420. Moreover, because of the individual collection of the back-scattered electrons 423, a three-dimensional (3D) reconstructed surface topography of the specimen 420 may be enabled. For example, when the top surface of the specimen 420 has features formed at two respective levels, each of which is vertically spaced from each other (hereinafter a "lower level" and a "higher level"). As such, each discrete segment of the photodetector 220 may receive different portions of the back-scattered electrons 423 from the lower level and higher level, respectively. In particular, the portion of the back-scattered electrons 423 from the lower level may be detected by one of the discrete segments as a weaker signal, and the portion of the back-scattered electrons 423 from the higher level may be detected by the one of the discrete segments as a stronger signal. Since each discrete segment are laterally disposed in respective positions, each discrete segment may detect respective stronger and weaker signals, which enables a reconstruction on the 3D surface topography of the specimen 420.

In an embodiment, a semiconductor device includes a tube-like structure comprising a plurality of dielectric layers and conductor layers that are disposed on top of one another; a conductor tip integrally formed with a cap conductor layer that is disposed on a top surface of the tube-like structure, wherein the conductor tip extends to a central hole of the tube-like structure; and at least one photodetector formed within a bottom portion of the tube-like structure.

In another embodiment, a method for forming a semiconductor device includes providing a substrate overlaid by a first sacrificial layer; forming one or more photodetectors in a bottom dielectric layer that is disposed over the first sacrificial layer; forming a shallow trench in a cap conductor layer that is disposed on a plurality of intermediate dielectric and conductor layers over the bottom dielectric layer; forming a deep trench coupled to the shallow trench, wherein the deep trench extends through the plurality of intermediate dielectric and conductor layers and the bottom dielectric layer; and refilling the shallow and deep trenches with a second sacrificial layer so as to form a concave cusp on a top surface of the second sacrificial layer.

Yet in another embodiment, a method of forming a semiconductor device includes: providing a substrate overlaid by a first sacrificial layer; forming a plurality of photodetectors in a bottom dielectric layer, wherein the bottom dielectric layer is disposed over the first sacrificial layer; forming a top conductor layer that is disposed on a plurality of intermediate dielectric and conductor layers over the bottom dielectric layer; forming a shallow trench in the top conductor layer; forming a deep trench coupled to the shallow trench, wherein the deep trench extends through the plurality of intermediate dielectric and conductor layers and the bottom dielectric layer; refilling the shallow and deep trenches with a second sacrificial layer so as to form a concave cusp on a top surface of the second sacrificial layer; etching the second sacrificial layer to further extend the concave cusp; refilling the concave cusp with a cap conductor layer so as to form a conductor tip in the concave cusp; removing the substrate; and removing the first and second sacrificial layers to expose the deep trench and part of the shallow trench so as to cause the conductor tip to be in the deep trench.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a tube-like structure comprising a plurality of dielectric layers and conductor layers that are disposed on top of one another;
   a conductor tip integrally formed with a cap conductor layer that is disposed on a top surface of the tube-like structure, wherein the conductor tip extends to a central hole of the tube-like structure; and
   at least one photodetector formed within a bottom portion of the tube-like structure.

2. The device of claim 1, wherein the photodetector includes a p-n junction diode.

3. The device of claim 1, wherein the at least one photodetector comprises at least four photodetectors each formed within the bottom portion of the tube-like structure.

4. The device of claim 3, wherein the at least four photodetectors are formed as a ring-like structure.

5. The device of claim 1, wherein the photodetector includes a semiconductor layer that is either p-type doped or n-type doped, and the semiconductor layer has an exposed surface.

6. The device of claim 5, wherein the exposed surface of the semiconductor layer is substantially coplanar with a bottom surface of the tube-like structure.

7. The device of claim 1, wherein the cap conductor layer is formed of tungsten and the plurality of conductor layers are formed of copper.

8. A semiconductor device, comprising:
   a bottom dielectric layer;

at least one photodetector formed in the bottom dielectric layer;
at least one intermediate dielectric layer formed over the bottom dielectric layer;
a top dielectric layer formed over the at least one intermediate dielectric layer;
a cap conductor formed over the top dielectric layer;
a hollow space traversing the top dielectric layer, the at least one intermediate dielectric layer and the bottom dielectric layer; and
a conductor tip extending downwardly from the cap conductor and into the hollow space.

9. The semiconductor device of claim 8, wherein the hollow space is in the shape of a cylinder.

10. The semiconductor device of claim 8, further comprising:
a bottom conductor layer formed over the bottom dielectric layer and below the at least one intermediate dielectric layer, wherein the hollow space traverses the at least one intermediate dielectric layer, the bottom conductor layer and the bottom dielectric layer.

11. The semiconductor device of claim 10, further comprising:
a top conductor layer formed over the at least one intermediate dielectric layer and below the cap conductor, wherein the hollow space traverses the top conductor layer, the at least one intermediate dielectric layer, the bottom conductor layer and the bottom dielectric layer.

12. The semiconductor device of claim 8, wherein the conductor tip is formed of the same material as the cap conductor layer.

13. The semiconductor device of claim 8, wherein the conductor tip and the cap conductor layer each comprise tungsten.

14. The semiconductor device of claim 8, wherein the at least one intermediate dielectric layer comprise a first intermediate dielectric layer and a second intermediate dielectric layer formed over the first intermediate dielectric layer.

15. The semiconductor device of claim 8, wherein both the bottom dielectric layer and the at least one intermediate dielectric layer are made from a low dielectric constant material.

16. A semiconductor device, comprising:
a bottom dielectric layer;
at least one photodetector formed in the bottom dielectric layer;
a bottom conductor layer formed over the bottom dielectric layer;
at least one intermediate dielectric layer formed over the bottom conductor layer;
a top dielectric layer formed over the at least one intermediate dielectric layer;
a top conductor layer formed over the top dielectric layer;
a cap conductor formed over the top conductor layer;
a hollow space traversing the top conductor layer, the top dielectric layer, the at least one intermediate dielectric layer, the bottom conductor layer and the bottom dielectric layer; and
a conductor tip extending downwardly from the cap conductor and into the hollow space.

17. The semiconductor device of claim 16, wherein the hollow space is in the shape of a cylinder.

18. The semiconductor device of claim 16, wherein the conductor tip is formed of the same material as the cap conductor layer.

19. The semiconductor device of claim 16, wherein the conductor tip and the cap conductor layer each comprise tungsten.

20. The semiconductor device of claim 16, wherein the at least one intermediate dielectric layers comprise a first intermediate dielectric layer and a second intermediate dielectric layer formed over the first intermediate dielectric layer.

* * * * *